(12) United States Patent
Nakagawa et al.

(10) Patent No.: US 12,572,065 B2
(45) Date of Patent: Mar. 10, 2026

(54) SUBSTRATE WITH CONDUCTIVE FILM, REFLECTIVE MASK BLANK, REFLECTIVE MASK, AND METHOD FOR MANUFACTURING SEMICONDUCTOR DEVICE

(71) Applicant: HOYA CORPORATION, Tokyo (JP)

(72) Inventors: Masanori Nakagawa, Tokyo (JP); Takashi Uchida, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 836 days.

(21) Appl. No.: 17/635,333

(22) PCT Filed: Jul. 13, 2020

(86) PCT No.: PCT/JP2020/027298
§ 371 (c)(1),
(2) Date: Feb. 14, 2022

(87) PCT Pub. No.: WO2021/039163
PCT Pub. Date: Mar. 4, 2021

(65) Prior Publication Data
US 2022/0283490 A1      Sep. 8, 2022

(30) Foreign Application Priority Data

Aug. 30, 2019      (JP) ................................. 2019-158348

(51) Int. Cl.
*G03F 1/24* (2012.01)
*G03F 1/38* (2012.01)

(52) U.S. Cl.
CPC . *G03F 1/24* (2013.01); *G03F 1/38* (2013.01)

(58) Field of Classification Search
None
See application file for complete search history.

(56) References Cited

U.S. PATENT DOCUMENTS 6,352,803 B1      3/2002   Tong et al.
2005/0238922 A1   10/2005   Kinoshita et al.
(Continued)

FOREIGN PATENT DOCUMENTS

CN          109814331 A      5/2019
JP          2003501823 A     1/2003
(Continued)

OTHER PUBLICATIONS

Meunier et al. X-ray diffractometry analysis of r.f.-magnetron-sputtered chromium/chromium nitride coatings, Surface and Coatings Technology, vol. 107, 1998, 149-158 (Year: 1998).*
(Continued)

*Primary Examiner* — Mark F. Huff
*Assistant Examiner* — Kevin J Drummey
(74) *Attorney, Agent, or Firm* — Sughrue Mion, PLLC

(57) ABSTRACT

A substrate with a conductive film for manufacturing a reflective mask, the substrate comprising a conductive film having excellent chemical resistance and a small surface roughness (Rms), is obtained.
A substrate with a conductive film comprises a conductive film on one of two main surfaces of the substrate. The conductive film comprises chromium. The conductive film comprises a structure in which a lower layer and an upper layer are layered in this order from the substrate side. The lower layer is amorphous. The upper layer has a crystallinity.

17 Claims, 3 Drawing Sheets

50

(56) References Cited

U.S. PATENT DOCUMENTS

| | | | |
|---|---|---|---|
| 2009/0253055 A1 | 10/2009 | Hayashi et al. | |
| 2013/0323630 A1* | 12/2013 | Maeshige | G03F 1/24 |
| | | | 430/5 |
| 2015/0301442 A1 | 10/2015 | Kageyama et al. | |
| 2016/0124298 A1* | 5/2016 | Hamamoto | G03F 1/24 |
| | | | 428/141 |
| 2017/0108768 A1 | 4/2017 | Hsu et al. | |
| 2018/0149962 A1 | 5/2018 | Kobayashi et al. | |
| 2019/0056653 A1* | 2/2019 | Kawahara | G03F 1/48 |
| 2019/0155140 A1 | 5/2019 | Lee et al. | |

FOREIGN PATENT DOCUMENTS

| | | | |
|---|---|---|---|
| JP | 2011124612 A | 6/2011 | |
| JP | 2012178577 A | 9/2012 | |
| JP | 2015215602 A | 12/2015 | |
| KR | 10-2014-0004157 A | 1/2014 | |
| TW | 201706709 A | 2/2017 | |
| WO | 2008072706 A1 | 6/2008 | |
| WO | 2012105698 A1 | 8/2012 | |

OTHER PUBLICATIONS

Udachan, S. L., Ayachit, N. H., & Udachan, L. A. (2019). Impact of substrates on the electrical properties of thin chromium films. Ingenieria Y Universidad, 23(2)) (Year: 2019).*

PCT/JP2020/027298, English Translation of International Search Report, Sep. 24, 2020, 2 pages.

TW109126338, "Office Action", Nov. 16, 2023, 7 pages.

SG11202201663T, "Invitation to Respond to Written Opinion", Feb. 20, 2024, 8 pages.

Korean Office Action dated Mar. 25, 2025 in Application No. 10-2022-7004851.

* cited by examiner (A)

(B)

(C)

(D)

X-RAY DIFFRACTION ANGLE (2θ) [degrees]

X-RAY DIFFRACTION ANGLE (2θ) [degrees]

SUBSTRATE WITH CONDUCTIVE FILM, REFLECTIVE MASK BLANK, REFLECTIVE MASK, AND METHOD FOR MANUFACTURING SEMICONDUCTOR DEVICE

CROSS-REFERENCE TO RELATED APPLICATIONS

This application is the National Stage of International Application No. PCT/JP2020/027298, filed Jul. 13, 2020, which claims priority to Japanese Patent Application No. 2019-158348, filed Aug. 30, 2019, and the contents of which is incorporated by reference.

TECHNICAL FIELD

The present disclosure relates to a reflective mask used for EUV lithography, and a substrate with a conductive film and a reflective mask blank for manufacturing the reflective mask. The present disclosure also relates to a method for manufacturing a semiconductor device using the reflective mask.

BACKGROUND ART

In recent years, in semiconductor industry, along with high integration of a semiconductor device, a fine pattern exceeding a transfer limit of a conventional photolithography method using ultraviolet light has been required. In order to make such fine pattern formation possible, EUV lithography, which is an exposure technique using extreme ultraviolet (hereinafter, referred to as "EUV") light, is promising. Here, the EUV light refers to light in a wavelength band of a soft X-ray region or a vacuum ultraviolet region, and specifically, is light having a wavelength of about 0.2 to 100 nm. A reflective mask has been proposed as a transfer mask used in this EUV lithography. In the reflective mask, a multilayer reflective film for reflecting exposure light is formed on a substrate, and a pattern forming thin film for absorbing exposure light is formed in a pattern shape on the multilayer reflective film.

The reflective mask is manufactured by forming a pattern on a pattern forming thin film by a photolithography method or the like from a reflective mask blank having a substrate, a multilayer reflective film formed on the substrate, and a pattern forming thin film formed on the multilayer reflective film.

In general, when a reflective mask is set on a mask stage of an exposure device, the reflective mask is fixed by an electrostatic chuck. Therefore, a conductive film (conductive back film) is formed on a back main surface (main surface opposite to a main surface on which a multilayer reflective film or the like is formed) of an insulating reflective mask blank substrate such as a glass substrate in order to promote fixing of the substrate by an electrostatic chuck.

Patent Document 1 describes a mask substrate including a substrate made of a low thermal expansion substance, at least one substance layer on a front surface side of the substrate, and at least one substance layer on a back surface side of the substrate. In addition, Patent Document 1 describes that the substance on the back surface side is a metal selected from the group consisting of Mo and Cr.

Patent Document 2 describes a substrate with a conductive film used for manufacturing a reflective mask blank for EUV lithography. Patent Document 2 describes that the conductive film contains chromium (Cr) and nitrogen (N), an average concentration of N in the conductive film is 0.1 at % or more and less than 40 at %, a crystal state of at least a surface of the conductive film is amorphous, a sheet resistance value of the conductive film is 27 $\Omega/\square$ or less, and a surface roughness (Rms) of the conductive film is 0.5 nm or less.

Patent Document 1: JP 2003-501823 A
Patent Document 2: WO 2008/072706 A

DISCLOSURE OF INVENTION

In a process of manufacturing a reflective mask blank, wet cleaning using an acidic aqueous solution (chemical solution) such as a sulfuric acid and hydrogen peroxide mixture (SPM) cleaning or wet cleaning using an alkaline aqueous solution (chemical solution) such as SC-1 cleaning is performed before a resist film is applied onto a pattern forming thin film. In addition, in the process of manufacturing a reflective mask blank, after a pattern is formed on the pattern forming thin film, wet cleaning using an acidic or alkaline aqueous solution (chemical solution) is performed in order to remove a resist pattern or the like. Furthermore, also in manufacture of a semiconductor device, wet cleaning using a chemical solution is performed in order to remove foreign substances adhering to a reflective mask during exposure. In general, since the reflective mask is repeatedly used, the cleaning is performed at least a plurality of times. Therefore, the reflective mask is required to have sufficient cleaning resistance. A chemical solution (an acidic or alkaline aqueous solution, for example, a sulfuric acid and hydrogen peroxide mixture in the case of SPM cleaning) is used for cleaning the reflective mask. Therefore, the conductive film used for the reflective mask needs to have resistance to a chemical such as a chemical solution (referred to as "chemical resistance" in the present specification).

Meanwhile, when a semiconductor device is manufactured using a reflective mask, the reflective mask is fixed to an exposure device by an electrostatic chuck. In order to prevent generation of particles due to rubbing between the conductive film and the electrostatic chuck, surface roughness (Rms) of the conductive film needs to be small.

Therefore, an aspect of the present disclosure is to obtain a substrate with a conductive film for manufacturing a reflective mask, the substrate including a conductive film having excellent chemical resistance and a small surface roughness (Rms). Another aspect of the present disclosure is to obtain a reflective mask blank and a reflective mask each including a conductive film having excellent chemical resistance and a small surface roughness (Rms).

As a result of intensive studies, the present inventors have found that the chemical resistance of a conductive film can be enhanced by increasing the crystallinity of the conductive film. Meanwhile, when the crystal state of the conductive film is amorphous, the surface roughness of the conductive film can be reduced. That is, in order to reduce the surface roughness of the conductive film, it is necessary to lower the crystallinity of the conductive film, contrary to the case of enhancing the chemical resistance of the conductive film. As a result of intensive studies, the present inventors have found that a conductive film including a predetermined lower layer and upper layer can have excellent chemical resistance and a small surface roughness (Rms), and have achieved the present disclosure. The present disclosure has the following configurations.

(Configuration 1)

Configuration 1 of the present disclosure is a substrate with a conductive film comprising a conductive film on one of two main surfaces of the substrate, in which the conductive film comprises chromium, the conductive film comprises a structure in which a lower layer and an upper layer are layered in this order from the substrate side, the lower layer is amorphous, and the upper layer has a crystallinity.
(Configuration 2)

Configuration 2 of the present disclosure is the substrate with a conductive film according to configuration 1, in which the upper layer is made of a material comprising nitrogen.
(Configuration 3)

Configuration 3 of the present disclosure is the substrate with a conductive film according to configuration 1 or 2, in which the lower layer is made of a material comprising oxygen.
(Configuration 4)

Configuration 4 of the present disclosure is the substrate with a conductive film according to any one of configurations 1 to 3, in which the chromium content of the upper layer is larger than the chromium content of the lower layer.
(Configuration 5)

Configuration 5 of the present disclosure is the substrate with a conductive film according to any one of configurations 1 to 4, in which when a diffracted X-ray intensity with respect to a diffraction angle $2\theta$ is measured by an X-ray diffraction method for the upper layer, a peak is detected in a range where the diffraction angle $2\theta$ is 41 degrees or more and 47 degrees or less.
(Configuration 6)

Configuration 6 of the present disclosure is the substrate with a conductive film according to configuration 5, in which the upper layer has a peak detected in a range where the diffraction angle $2\theta$ is 56 degrees or more and 60 degrees or less.
(Configuration 7)

Configuration 7 of the present disclosure is the substrate with a conductive film according to configuration 5 or 6, in which the upper layer has no peak detected in a range where the diffraction angle $2\theta$ is 35 degrees or more and 38 degrees or less.
(Configuration 8)

Configuration 8 of the present disclosure is a substrate with a conductive film, in which a multilayer reflective film in which a high refractive index layer and a low refractive index layer are alternately layered is formed on the main surface opposite to the main surface on which the conductive film of the substrate with a conductive film according to any one of configurations 1 to 7 is formed.
(Configuration 9)

Configuration 9 of the present disclosure is the substrate with a conductive film according to configuration 8, in which a protective film is formed on the multilayer reflective film.
(Configuration 10)

Configuration 10 of the present disclosure is a reflective mask blank comprising a structure in which a multilayer reflective film and a pattern forming thin film are layered in this order on one main surface of a substrate, the reflective mask blank comprising a conductive film on the other main surface of the substrate, in which the conductive film comprises chromium, the conductive film comprises a structure in which a lower layer and an upper layer are layered in this order from the substrate side, the lower layer is amorphous, and the upper layer has a crystallinity.

(Configuration 11)

Configuration 11 of the present disclosure is the reflective mask blank according to configuration 10, in which the upper layer is made of a material comprising nitrogen.
(Configuration 12)

Configuration 12 of the present disclosure is the reflective mask blank according to configuration 10 or 11, in which the lower layer is made of a material comprising oxygen.
(Configuration 13)

Configuration 13 of the present disclosure is the reflective mask blank according to any one of configurations 10 to 12, in which the chromium content of the upper layer is larger than the chromium content of the lower layer.
(Configuration 14)

Configuration 14 of the present disclosure is the reflective mask blank according to any one of configurations 10 to 13, in which when a diffracted X-ray intensity with respect to a diffraction angle $2\theta$ is measured by an X-ray diffraction method for the upper layer, a peak is detected in a range where the diffraction angle $2\theta$ is 41 degrees or more and 47 degrees or less.
(Configuration 15)

Configuration 15 of the present disclosure is the reflective mask blank according to configuration 14, in which the upper layer has a peak detected in a range where the diffraction angle $2\theta$ is 56 degrees or more and 60 degrees or less.
(Configuration 16)

Configuration 16 of the present disclosure is the reflective mask blank according to configuration 14 or 15, in which the upper layer has no peak detected in a range where the diffraction angle $2\theta$ is 35 degrees or more and 38 degrees or less.
(Configuration 17)

Configuration 17 of the present disclosure is the reflective mask blank according to any one of configurations 10 to 16, in which a protective film is formed between the multilayer reflective film and the pattern forming thin film.
(Configuration 18)

Configuration 18 of the present disclosure is a reflective mask comprising a transfer pattern formed on the pattern forming thin film of the reflective mask blank according to any one of configurations 10 to 17.
(Configuration 19)

Configuration 19 of the present disclosure is a method for manufacturing a semiconductor device, the method comprising exposing and transferring a transfer pattern onto a resist film on a semiconductor substrate using the reflective mask according to configuration 18.

According to the present disclosure, it is possible to obtain a substrate with a conductive film for manufacturing a reflective mask, the substrate including a conductive film having excellent chemical resistance and a small surface roughness (Rms). In addition, according to the present disclosure, it is possible to obtain a reflective mask blank and a reflective mask each including a conductive film having excellent chemical resistance and a small surface roughness (Rms).

DESCRIPTION OF EMBODIMENTS

Hereinafter, an embodiment of the present disclosure will be specifically described with reference to the drawings. Note that the following embodiment is one mode for embodying the present disclosure and does not limit the present disclosure within the scope thereof.

Figures 1, 2, 3, 4, 5:
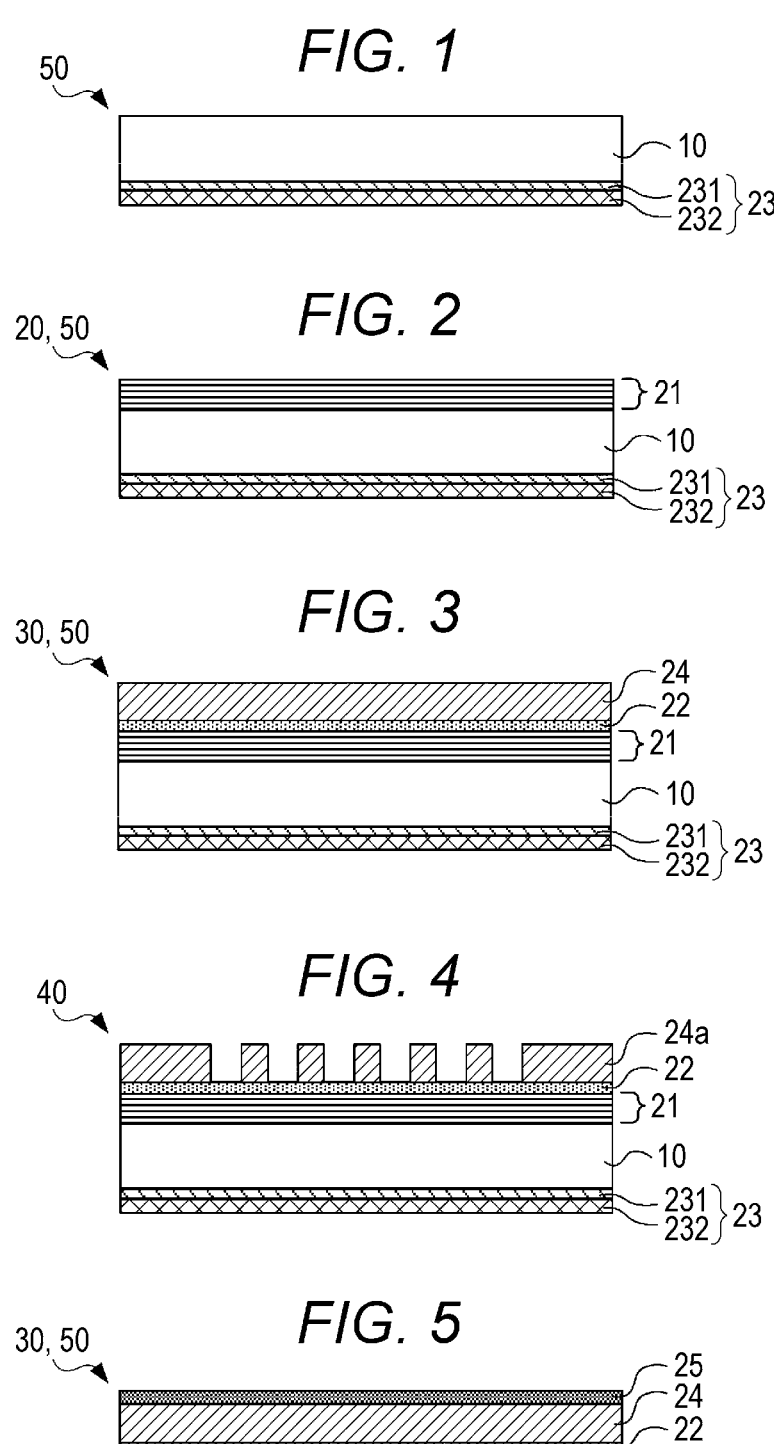
FIG. 1 is a schematic cross-sectional diagram illustrating an example of a configuration of a substrate with a conductive film according to an embodiment of the present disclosure.
FIG. 2 is a schematic cross-sectional diagram illustrating an example of a configuration of a substrate with a multilayer reflective film (substrate with a conductive film) according to the embodiment of the present disclosure.
FIG. 3 is a schematic cross-sectional diagram illustrating an example of a configuration of a reflective mask blank (substrate with a conductive film) according to the embodiment of the present disclosure.
FIG. 4 is a schematic cross-sectional diagram illustrating an example of a reflective mask according to the embodiment of the present disclosure.
FIG. 5 is a schematic cross-sectional diagram illustrating another example of the configuration of the reflective mask blank according to the embodiment of the present disclosure.

FIG. 1 illustrates an example of a substrate with a conductive film 50 according to the present embodiment. The substrate with a conductive film 50 according to the present embodiment includes a predetermined conductive film 23 on at least one of two main surfaces of a mask blank substrate 10 (also simply referred to as a "substrate 10").

In the present specification, out of main surfaces of the mask blank substrate 10, a main surface (also simply referred to as a "back surface") on which the conductive film 23 (also referred to as a "conductive back film") is formed is referred to as a "back main surface". In addition, in the present specification, a main surface of the substrate with a conductive film 50 on which the conductive film 23 is not formed is referred to as a "front main surface". The multilayer reflective film 21 in which a high refractive index layer and a low refractive index layer are alternately layered is formed on the front main surface of the mask blank substrate 10.

FIG. 1 illustrates the substrate with a conductive film 50 in which the predetermined conductive film 23 is disposed on one main surface (back main surface) of the substrate 10 and a thin film is not formed on a front main surface. In the present specification, the substrate with a conductive film 50 is one in which the conductive film 23 is formed on at least a back main surface of the mask blank substrate 10, and the substrate with a conductive film 50 also includes one in which the multilayer reflective film 21 is formed on the other main surface (a substrate with a multilayer reflective film 20), one in which a pattern forming thin film 24 is further formed (a reflective mask blank 30), and the like.

FIG. 2 illustrates the substrate with a multilayer reflective film 20 in which the conductive film 23 is formed on a back main surface according to the present embodiment. The substrate with a multilayer reflective film 20 illustrated in FIG. 2 includes the predetermined conductive film 23 on the back main surface. Therefore, the substrate with a multilayer reflective film 20 illustrated in FIG. 2 is a type of the substrate with a conductive film 50 according to the present embodiment.

FIG. 3 is a schematic diagram illustrating an example of the reflective mask blank 30 according to the present embodiment. The reflective mask blank 30 of FIG. 3 includes the multilayer reflective film 21, a protective film 22, and the pattern forming thin film 24 on a front main surface of the mask blank substrate 10. In addition, the reflective mask blank 30 of FIG. 3 includes the predetermined conductive film 23 on a back main surface thereof. Therefore, the reflective mask blank 30 illustrated in FIG. 3 is a type of the substrate with a conductive film 50 according to the present embodiment.

FIG. 5 is a schematic diagram illustrating another example of the reflective mask blank 30 according to the present embodiment. The reflective mask blank 30 illustrated in FIG. 5 includes the multilayer reflective film 21, the pattern forming thin film 24, the protective film 22 formed between the multilayer reflective film 21 and the pattern forming thin film 24, and an etching mask film 25 formed on a surface of the pattern forming thin film 24. The reflective mask blank 30 according to the present embodiment includes the predetermined conductive film 23 on a back main surface thereof. Therefore, the reflective mask blank 30 illustrated in FIG. 5 is a type of the substrate with a conductive film 50 according to the present embodiment. Note that when the reflective mask blank 30 having the etching mask film 25 is used, as described later, the etching mask film 25 may be peeled off after a transfer pattern is formed on the pattern forming thin film 24. In addition, in the reflective mask blank 30 in which the etching mask film 25 is not formed, the pattern forming thin film 24 may have a stack formed of a plurality of layers, and materials constituting the plurality of layers may have etching characteristics different from each other to form the pattern forming thin film 24 having an etching mask function.

In the present specification, the expression "including (having) a predetermined thin film (for example, the conductive film 23) on a main surface of the mask blank substrate 10" means that the predetermined thin film is disposed in contact with a main surface of the mask blank substrate 10, and also means that there is another film between the mask blank substrate 10 and the predetermined thin film. The same applies to films other than the predetermined thin film. For example, the expression "having a film B on a film A" means that the film A and the film B are disposed so as to be in direct contact with each other, and also means that there is another film between the film A and the film B. In addition, in the present specification, for example, the expression "the film A is disposed in contact with a surface of the film B" means that the film A and the film B are disposed in direct contact with each other without another film interposed between the film A and the film B.

Next, surface roughness (Rms), which is a parameter indicating a surface state of the mask blank substrate 10 and a surface state of a surface of a thin film constituting the reflective mask blank 30 or the like, will be described.

Root mean square (Rms) as a representative index of surface roughness is root mean square roughness, which is a square root of a value obtained by averaging squares of deviations from a mean line to a measurement curve. Rms is expressed by the following formula (1).

[Mathematical formula 1]

$$Rms = \sqrt{\frac{1}{l} \int_0^l Z^2(x)dx} \qquad (1)$$

In formula (1), l represents a reference length, and Z represents a height from a mean line to a measurement curve.

Rms is conventionally used to manage the surface roughness of the mask blank substrate 10. By using Rms, the surface roughness can be grasped numerically.

[Substrate with a Conductive Film 50]

Next, the substrate with a conductive film 50 according to the embodiment will be specifically described. First, the mask blank substrate 10 (also simply referred to as the "substrate 10") used for the substrate with a conductive film 50 will be described.

<Mask Blank Substrate 10>

As the mask blank substrate 10, one having a low thermal expansion coefficient in a range of 0±5 ppb/° C. is preferably used in order to prevent distortion of a transfer pattern (a thin film pattern 24a of the pattern forming thin film 24 described later) due to heat during exposure with EUV light. Examples of a usable material having a low thermal expansion coefficient in this range include $SiO_2$—$TiO_2$-based glass, multicomponent glass ceramics, and the like.

A front main surface of the substrate 10 on a side where a transfer pattern is formed has been subjected to a surface treatment so as to have high flatness from a viewpoint of obtaining at least pattern transfer accuracy and position accuracy. In a case of EUV exposure, in an area of 132 mm×132 mm of the main surface of the substrate 10 on a side where a transfer pattern is formed, flatness is preferably 0.1 µm or less, more preferably 0.05 µm or less, and still more preferably 0.03 µm or less. In addition, a back main surface opposite to the front main surface is a surface to be electrostatically chucked when being set in an exposure device. In an area of 132 mm×132 mm of the back main surface, flatness is preferably 0.1 µm or less, more preferably 0.05 µm or less, and still more preferably 0.03 µm or less. Note that in an area of 142 mm×142 mm of the back main surface of the reflective mask blank 30, flatness is preferably 1 µm or less, more preferably 0.5 µm or less, and still more preferably 0.3 µm or less.

In addition, high surface smoothness of the substrate 10 is also an extremely important item. Surface roughness of the front main surface on which the thin film pattern 24a of the pattern forming thin film 24 for transfer is formed is preferably 0.1 nm or less in terms of root mean square roughness (RMS). Note that the surface smoothness can be measured with an atomic force microscope.

Furthermore, the substrate 10 preferably has high rigidity in order to prevent deformation due to a film stress applied to a film (such as the multilayer reflective film 21) formed on the substrate 10. In particular, the substrate 10 preferably has a high Young's modulus of 65 GPa or more.

<Conductive Film 23>

Next, the conductive film 23 included in the substrate with a conductive film 50 according to the present embodiment will be described.

As illustrated in FIG. 1, the conductive film 23 for an electrostatic chuck is formed on a back main surface of the substrate 10 (main surface opposite to a main surface on which the multilayer reflective film 21 is formed).

The predetermined conductive film 23 of the substrate with a conductive film 50 according to the present embodiment contains chromium. The predetermined conductive film 23 preferably contains nitrogen. By inclusion of chromium and nitrogen in the predetermined conductive film 23, the chemical resistance of the predetermined conductive film 23 can be further enhanced.

The conductive film 23 of the substrate with a conductive film 50 according to the present embodiment contains chromium. By inclusion of chromium in the predetermined conductive film 23, conductivity can be imparted to the conductive film 23.

The conductive film 23 included in the substrate with a conductive film 50 according to the present embodiment includes a lower layer 231 and an upper layer 232. Specifically, the conductive film 23 of the substrate with a conductive film 50 according to the present embodiment has a structure in which the lower layer 231 and the upper layer 232 are layered in this order from the substrate side.

First, the lower layer 231 of the conductive film 23 of the substrate with a conductive film 50 according to the present embodiment will be described. The crystal state of the lower layer 231 according to the present embodiment is preferably amorphous. In the present specification, the expression "the lower layer 231 is amorphous" means that that no peak is observed in a diffracted X-ray spectrum when the lower layer 231 is measured by a predetermined X-ray diffraction method. The diffracted X-ray spectrum and the peak will be described later. In addition, the crystal state of the lower layer 231 can also be specified from an electron beam diffraction image obtained by a transmission electron microscope (TEM) or the like. That is, a cross-sectional sample of the substrate with a conductive film 50 is prepared, and the lower layer 231 is irradiated with an electron beam from a cross-sectional direction to acquire an electron beam diffraction image. From the electron beam diffraction image, it can be specified whether the lower layer 231 is amorphous or has a crystallinity.

When the crystal state of the lower layer 231 of the conductive film 23 is amorphous, the surface roughness of the lower layer 231 can be reduced. In the substrate with a conductive film 50 according to the present embodiment, since the surface roughness of the lower layer 231 is small, when the predetermined upper layer 232 is further disposed on a surface of the lower layer 231, the surface roughness of the upper layer 232 can be reduced. The substrate with a conductive film 50 according to the present embodiment has a small surface roughness (Rms) of the conductive film 23, and therefore can prevent generation of particles due to rubbing between the conductive film 23 of a reflective mask 40 obtained by the substrate with a conductive film 50 according to the present embodiment and an electrostatic chuck. A reason why the surface roughness of the upper layer 232 is reduced by building up the upper layer 232 having a crystallinity on the lower layer 231 in an amorphous bonding state is presumed to be due to the following action. Note that the following presumption is based on the presumption of the present inventors at the time of filing, and does not limit the scope of the present disclosure at all.

In a film having a crystallinity, surface roughness is generated due to the sizes of crystal grains constituting the film. Meanwhile, in an amorphous film, there is no long order for arrangement of crystal planes inside the film, crystal grains are refined, and the surface roughness of the amorphous film is suppressed as compared with that of the crystalline film. In a combination of the amorphous lower layer 231 and the crystalline upper layer 232, mixing occurs between the upper layer 232 and the lower layer 231 in a process of forming the upper layer 232 by a sputtering method, and crystal grains are refined. It is presumed that this suppresses coarsening of crystal grains in an initial film growth process of the upper layer 232, thereby reducing the surface roughness.

The lower layer 231 of the conductive film 23 of the substrate with a conductive film 50 according to the present embodiment is preferably made of a material containing oxygen. By inclusion of chromium and oxygen in the material of the lower layer 231, the crystal state of the lower layer 231 can be easily made amorphous. In order to more easily make the crystal state of the lower layer 231 amorphous, the oxygen content of the lower layer 231 is preferably 1 atomic % or more and 20 atomic % or less, and more preferably 3 atomic % or more and 15 atomic % or less.

The lower layer 231 of the conductive film 23 of the substrate with a conductive film 50 according to the present embodiment can further contain an element other than chromium and oxygen as long as the effect of the present embodiment is not impaired. For example, the lower layer 231 can further contain nitrogen. In addition, examples of the element further contained in the lower layer 231 include Ag, Au, Cu, Al, Mg, W, Ru, Co, and the like which are highly conductive metals. However, in order not to hinder the crystal state of the lower layer 231 from being amorphous, the content of components other than chromium and oxygen is preferably 30 atomic % or less, and more preferably 15 atomic % or less.

Next, the upper layer 232 of the conductive film 23 of the substrate with a conductive film 50 according to the present embodiment will be described. The upper layer 232 of the conductive film 23 of the substrate with a conductive film 50 according to the present embodiment preferably has a crystallinity. In the present specification, the expression "the upper layer 232 has a crystallinity." means that at least one peak is observed in a diffracted X-ray spectrum when the upper layer 232 is measured by a predetermined X-ray diffraction method. The diffracted X-ray spectrum and the peak will be described later. In addition, the crystal state of the upper layer 232 can also be specified from an electron beam diffraction image obtained by a transmission electron microscope (TEM) or the like. That is, a cross-sectional sample of the substrate with a conductive film 50 is prepared, and the upper layer 232 is irradiated with an electron beam from a cross-sectional direction to acquire an electron beam diffraction image. From the electron beam diffraction image, it can be specified whether the upper layer 232 is amorphous or has a crystallinity.

When the crystal state of the upper layer 232 of the conductive film 23 has a crystallinity, the chemical resistance of the upper layer 232 disposed on an outermost surface of the conductive film 23 can be enhanced. Therefore, by inclusion of the upper layer 232 having a crystallinity as a crystal state in the conductive film 23, the chemical resistance of the conductive film 23 can be enhanced. Therefore, when the reflective mask 40 manufactured using the substrate with a conductive film 50 according to the present embodiment is repeatedly cleaned using a chemical such as a chemical solution, deterioration of the conductive film 23 can be suppressed.

The upper layer 232 of the substrate with a conductive film 50 according to the present embodiment is preferably made of a material containing nitrogen. By inclusion of chromium and nitrogen in the material of the upper layer 232, the mechanical strength of the upper layer 232 can be enhanced as compared with a case where the upper layer 232 is made only of chromium. In general, a chromium nitride-based film is an amorphous film when the nitrogen content is within a predetermined range. A chromium nitride-based film having a nitrogen content below the predetermined range is a metallic film having a crystallinity, and a chromium nitride-based film having a nitrogen content above the predetermined range is a high nitride film having a crystallinity. Therefore, in order to further enhance the conductivity while making the upper layer 232 have a crystallinity, the nitrogen content of the upper layer 232 is preferably 1 atomic % or more and 15 atomic % or less, and more preferably 2 atomic % or more and 10 atomic % or less.

In addition, in order to further enhance the chemical resistance of the upper layer 232 of the predetermined conductive film 23, the upper layer 232 of the predetermined conductive film 23 of the substrate with a conductive film 50 according to the present embodiment is preferably made only of chromium and nitrogen except for impurities that are inevitably mixed. Note that, in the present specification, even when it is simply described that "the thin film contains only chromium and nitrogen", it means that the thin film can contain impurities that are inevitably mixed in addition to chromium and nitrogen.

The upper layer 232 of the conductive film 23 of the substrate with a conductive film 50 according to the present embodiment can further contain an element other than chromium and nitrogen as long as the effect of the present embodiment is not impaired. Examples of the element further contained in the upper layer 232 include Ag, Au, Cu, Al, Mg, W, Ru, Co, and the like which are highly conductive metals. However, in order not to hinder the crystal state of the upper layer 232 from having a crystallinity, the content of components other than chromium and nitrogen is preferably 30 atomic % or less, and more preferably 15 atomic % or less.

The chromium content of the upper layer 232 of the substrate with a conductive film 50 according to the present embodiment is preferably larger than the chromium content of the lower layer 231. The higher the chromium content in the thin film, the lower the sheet resistance. By setting the chromium content of the upper layer 232 to a relatively large value, fixing by an electrostatic chuck can be more reliably performed.

The upper layer 232 of the predetermined conductive film 23 of the substrate with a conductive film 50 according to the present embodiment preferably has a predetermined crystallinity. Specifically, as described below, when the upper layer 232 is measured by an X-ray diffraction method, the upper layer 232 preferably exhibits a diffracted X-ray spectrum (hereinafter, such a diffracted X-ray spectrum may be referred to as a "predetermined diffracted X-ray spectrum") in which a peak is detected at a predetermined diffraction angle 2θ. Detection of a peak in a diffracted X-ray spectrum means that the upper layer 232 to be measured has a crystallinity.

Figure 7:
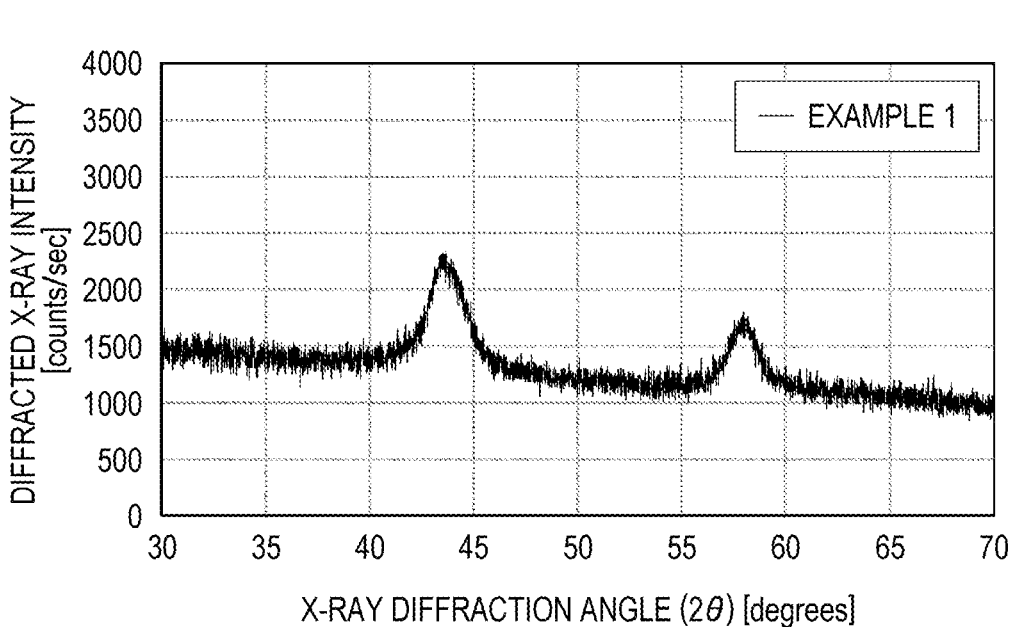
FIG. 7 is a diagram (diffracted X-ray spectrum) illustrating a diffracted X-ray intensity (counts/second) with respect to an X-ray diffraction angle (2θ) for Example 1.

When a diffracted X-ray intensity with respect to the diffraction angle 2θ is measured by an X-ray diffraction method using a CuK$_\alpha$ ray for the upper layer 232 of the predetermined conductive film 23 of the substrate with a conductive film 50 according to the present embodiment, a peak is preferably detected in a range where the diffraction angle 2θ is 41 degrees or more and 47 degrees or less. FIG. 7 illustrates a diffracted X-ray spectrum (diffracted X-ray intensity with respect to the diffraction angle 2θ) obtained by measuring a diffracted X-ray intensity for the upper layer 232 of the predetermined conductive film 23 according to the present embodiment. As illustrated in FIG. 7, in the diffracted X-ray spectrum of Example 1, a peak is detected in a range where the diffraction angle 2θ is 41 degrees or more and 47 degrees or less. Note that it is presumed that this peak corresponds to a peak of a (111) plane of $Cr_2N$ or a (200) plane of CrN, but the present disclosure is not bound by this presumption. Detection of a peak in a range where the diffraction angle 2θ is 41 degrees or more and 47 degrees or less means that the upper layer 232 to be measured has a crystallinity. A peak is detected in a range where the diffraction angle 2θ is 41 degrees or more and 47 degrees or less. As a result, it is possible to more reliably obtain the substrate with a conductive film 50 including the conductive film 23 (upper layer 232) having excellent chemical resistance.

In the present specification, a peak detected by an X-ray diffraction method is a peak obtained by illustrating measurement data of a diffracted X-ray intensity with respect to the diffraction angle 2θ using a $CuK_\alpha$ ray, and can be defined as a peak in which the height of the peak obtained by subtracting a background from the measurement data (diffracted X-ray spectrum) is twice or more the magnitude of a background noise (noise width) around the peak. The diffraction angle 2θ of the peak can be defined as a diffraction angle 2θ indicating a maximum value of the peak obtained by subtracting a background from the measurement data.

When a diffracted X-ray intensity with respect to the diffraction angle 2θ is measured by an X-ray diffraction method using a $CuK_\alpha$ ray for the upper layer 232 of the predetermined conductive film 23 of the substrate with a conductive film 50 according to the present embodiment, a peak is preferably detected in a range where the diffraction angle 2θ is 56 degrees or more and 60 degrees or less. As illustrated in FIG. 7, in the diffracted X-ray spectrum of the upper layer 232 of Example 1 having excellent chemical resistance, a peak is detected in a range where the diffraction angle 2θ is 56 degrees or more and 60 degrees or less. Note that it is presumed that this peak corresponds to a peak of a (112) plane of $Cr_2N$, but the present disclosure is not bound by this presumption.

The present inventors have found that, in the upper layer 232 of the conductive film 23, a thin film having a crystal structure in which a peak is detected in a range where the diffraction angle 2θ is 56 degrees or more and 60 degrees or less has excellent chemical resistance. Therefore, when the reflective mask 40 is manufactured using the substrate with a conductive film 50 including the conductive film 23 having such an upper layer 232, even if the reflective mask 40 is repeatedly cleaned using a chemical such as a chemical solution, deterioration of the thin film of the reflective mask 40 can be suppressed.

When a diffracted X-ray intensity with respect to the diffraction angle 2θ is measured by an X-ray diffraction method using a $CuK_\alpha$ ray for the upper layer 232 of the predetermined conductive film 23 of the substrate with a conductive film 50 according to the present embodiment, a peak is preferably not detected in a range where the diffraction angle 2θ is 35 degrees or more and 38 degrees or less. As illustrated in FIG. 7, in the diffracted X-ray spectrum of Example 1, no peak is detected in a range where the diffraction angle 2θ is 35 degrees or more and 38 degrees or less. Note that it is presumed that a peak in this range of the diffraction angle 2θ corresponds to a peak of a (111) plane of CrN, but the present disclosure is not bound by this presumption.

The upper layer 232 of the predetermined conductive film 23 of the substrate with a conductive film 50 according to the present embodiment preferably contains chromium and nitrogen. As described below, the crystal structure of the predetermined thin film is changed depending on the content of nitrogen in the predetermined thin film (the upper layer 232 of the conductive film 23) containing chromium and nitrogen.

As described above, in the present embodiment, by using the conductive film 23 including the predetermined upper layer 232 and the predetermined lower layer 231, the substrate with a conductive film 50 including the conductive film 23 having excellent chemical resistance and a small surface roughness (Rms) can be obtained. Therefore, when the reflective mask 40 manufactured using the substrate with a conductive film 50 according to the present embodiment is repeatedly cleaned using a chemical such as a chemical solution, deterioration of the conductive film 23 can be suppressed. In addition, since the surface roughness (Rms) of the conductive film 23 is small, it is possible to prevent generation of particles due to rubbing between the conductive film 23 of the reflective mask 40 and an electrostatic chuck. Therefore, the substrate with conductive film 50 according to the present embodiment can be preferably used as the substrate with a conductive film 50 for manufacturing the reflective mask 40.

As a method for forming the predetermined conductive film 23 (the upper layer 232 and the lower layer 231) according to the present embodiment, any known method can be used as long as necessary characteristics are obtained. As a method for forming the predetermined conductive film 23, a sputtering method such as a DC magnetron sputtering method, an RF sputtering method, or an ion beam sputtering method is generally used. In order to more reliably obtain necessary characteristics, a reactive sputtering method can be used. When the predetermined conductive film 23 (the upper layer 232 or the lower layer 231) contains chromium and nitrogen, by introducing a nitrogen gas using a chromium target and forming a film in a nitrogen atmosphere by sputtering, the predetermined conductive film 23 (the upper layer 232 or the lower layer 231) containing chromium and nitrogen can be formed. When the predetermined conductive film 23 (the upper layer 232 or the lower layer 231) contains chromium and oxygen, by introducing an oxygen gas using a chromium target and forming a film in an oxygen atmosphere by sputtering, the predetermined conductive film 23 (the upper layer 232 or the lower layer 231) containing chromium and oxygen can be formed. In addition, by introducing both a nitrogen gas and an oxygen gas and forming a film by sputtering, the predetermined conductive film 23 (the upper layer 232 or the lower layer 231) containing chromium, nitrogen, and oxygen can be formed. Note that by controlling the flow rate of the nitrogen gas and/or the oxygen gas introduced at the time of sputtering, the upper layer 232 or the lower layer 231 of the predetermined conductive film 23 having the diffracted X-ray spectrum can be formed. In addition to the nitrogen gas and/or the oxygen gas, an inert gas such as an argon gas can be used in combination.

In the method for forming the predetermined conductive film 23 (the upper layer 232 and the lower layer 231), specifically, the film is preferably formed while the substrate 10 is rotated on a horizontal plane with a film formation surface of the substrate 10 for forming the predetermined conductive film 23 facing upward. At this time, the film is preferably formed at a position where a central axis of the substrate 10 and a straight line passing through the center of a sputtering target and parallel to the central axis of the substrate 10 are shifted from each other. That is, the predetermined conductive film 23 is preferably formed by inclining the sputtering target at a predetermined angle with respect to the film formation surface. The sputtering target and the substrate 10 are disposed in this manner, and the facing sputtering target is sputtered. As a result, the predetermined conductive film 23 can be formed. The predetermined angle is preferably an angle at which an inclination angle of the sputtering target is 5 degrees or more and 30 degrees or less. In addition, a gas pressure during sputtering film formation is preferably 0.03 Pa or more and 0.1 Pa or less.

Each of the upper layer 232 and the lower layer 231 of the conductive film 23 can be a uniform film in which the concentrations of elements (for example, a chromium element and a nitrogen element) contained in the thin film are uniform except for a surface layer affected by surface oxidation. In addition, each of the upper layer 232 and the lower layer 231 can be an inclined composition film in which the concentrations of elements contained in the upper layer 232 or the lower layer 231 change in a thickness direction of the upper layer 232 or the lower layer 231. In addition, the upper layer 232 or the lower layer 231 can be a layered film including a plurality of layers having a plurality of different compositions as long as the effect of the present embodiment is not impaired.

The substrate with a conductive film 50 according to the present embodiment can include, for example, a hydrogen intrusion suppressing film that suppresses intrusion of hydrogen from the substrate 10 (glass substrate) into the conductive film 23 between the substrate 10 and the conductive film 23. The presence of the hydrogen intrusion suppressing film can suppress incorporation of hydrogen into the conductive film 23, and can suppress an increase in a compressive stress of the conductive film 23.

A material of the hydrogen intrusion suppressing film may be any type of material as long as the material hardly transmits hydrogen and can suppress intrusion of hydrogen from the substrate 10 (glass substrate) into the conductive film 23. Specific examples of the material of the hydrogen intrusion suppressing film include Si, $SiO_2$, SiON, SiCO, SiCON, SiBO, SiBON, Cr, CrN, CrO, CrON, CrC, CrCN, CrCO, CrCON, Mo, MoSi, MoSiN, MoSiO, MoSiCO, MoSiON, MoSiCON, TaO, TaON, and the like. The hydrogen intrusion suppressing film can be a single layer made of these materials, or may be a multilayer or an inclined composition film. CrO can be used as a material of the hydrogen intrusion suppressing film.

An electrical characteristic required for the conductive film 23 having conductivity for an electrostatic chuck is usually 150 Ω/□ (Ω/square) or less, and preferably 100 Ω/□ or less. The thickness of the conductive film 23 is not particularly limited as long as a function as being for an electrostatic chuck is fulfilled. The thickness of the conductive film 23 is usually 20 nm to 250 nm. In addition, the thickness of the lower layer 231 is preferably 5 to 50 nm, and the thickness of the upper layer 232 is preferably 15 to 200 nm. In addition, the conductive film 23 further has a function of stress adjustment on a side of the back main surface of the reflective mask blank 30. The conductive film 23 is adjusted such that the flat reflective mask blank 30 can be obtained in balance with a stress from various films formed on the front main surface.

The conductive film 23 preferably has a film reduction amount of 1 nm or less when SPM cleaning is performed once. As a result, in a process of manufacturing the reflective mask blank 30, the reflective mask 40, and/or a semiconductor device, even when wet cleaning using an acidic aqueous solution (chemical solution) such as SPM cleaning is performed, a sheet resistance, a mechanical strength, and/or a transmittance, and the like required for the conductive film 23 are not impaired.

Note that the SPM cleaning is a cleaning method using $H_2SO_4$ and $H_2O_2$, and refers to cleaning performed using a cleaning liquid in which a ratio of $H_2SO_4:H_2O_2$ is 1:1 to 5:1, for example, under conditions of a treatment time of about 10 minutes at a temperature of 80 to 150° C.

Conditions of the SPM cleaning serving as a criterion for determining cleaning resistance in the present embodiment are as follows.

| | |
|---|---|
| Cleaning liquid | $H_2SO_4:H_2O_2$ = 2:1 (weight ratio) |
| Cleaning temperature | 120° C. |
| Cleaning time | 10 minutes |

In addition, a pattern transfer device for manufacturing a semiconductor device usually includes an electrostatic chuck for fixing the reflective mask 40 to be mounted on a stage. The conductive film 23 formed on a back main surface of the reflective mask 40 is fixed to the stage of the pattern transfer device by the electrostatic chuck.

The surface roughness of the conductive film 23 is preferably 0.5 nm or less, and more preferably 0.4 nm or less in terms of a root mean square roughness (Rms) obtained by measuring a region of 1 μm×1 μm with an atomic force microscope. When the surface of the conductive film 23 has the predetermined root mean square roughness (Rms), generation of particles due to rubbing between the electrostatic chuck and the conductive film 23 can be prevented.

In addition, in the pattern transfer device, when a moving speed of the stage on which the reflective mask 40 is mounted is increased to increase production efficiency, a load is further applied to the conductive film 23. Therefore, the conductive film 23 is desired to have a higher mechanical strength. The mechanical strength of the conductive film 23 can be evaluated by measuring a crack generation load of the substrate with a conductive film 50. The mechanical strength is required to be 300 mN or more in terms of a value of a crack generation load. The mechanical strength is preferably 600 mN or more, and more preferably more than 1000 mN in terms of a value of a crack generation load. When the crack generation load is in a predetermined range, it can be said that the conductive film 23 has a mechanical strength required as the conductive film 23 for an electrostatic chuck.

Japanese Patent No. 5883249 describes a method for correcting an error of a mask for photolithography with a laser beam. When the technique described in Japanese Patent No. 5883249 is applied to the reflective mask 40, it is conceivable to irradiate the reflective mask 40 with a laser beam from a back main surface of the substrate 10. However, since the conductive film 23 is disposed on the back main surface of the substrate 10 of the reflective mask 40, there arises a problem that the laser beam hardly passes through the reflective mask 40. When chromium is used as a material of the thin film, the thin film has a relatively high visible light transmittance at a predetermined wavelength. Therefore, when a thin film containing chromium is used as the conductive film 23 of the reflective mask 40, the defect correction as described in Japanese Patent No. 5883249 can be performed by irradiating the reflective mask 40 with predetermined light from the back main surface.

As the film thickness of the conductive film 23, an appropriate film thickness can be selected in relation to transmittance in light having a wavelength of 532 nm and electrical conductivity. For example, when the electrical conductivity of a material is high, the film thickness can be made thin, and the transmittance can be increased. The film thickness of the conductive film 23 of the substrate with a conductive film 50 according to the present embodiment using chromium as a material of the thin film is preferably 20 nm or more and 50 nm or less. When the conductive film 23 has a predetermined film thickness, the conductive film 23 having more appropriate transmittance and conductivity can be obtained.

The transmittance of the conductive film 23 at a wavelength of 532 nm is preferably 10% or more, more preferably 20% or more, and still more preferably 25% or more. The transmittance at a wavelength of 632 nm is preferably 25% or more. When the transmittance of light having a predetermined wavelength of the conductive film 23 of the substrate with a conductive film 50 is in a predetermined range, it is possible to obtain the reflective mask 40 capable of correcting a positional deviation of the reflective mask 40 from a side of the back main surface with a laser beam or the like.

Note that the transmittance in the present embodiment is obtained by irradiating the substrate with a conductive film 50 including the conductive film 23 with light having a wavelength of 532 nm from the conductive film 23 side and measuring transmitted light that has passed through the conductive film 23 and the substrate 10.

<Substrate with a Multilayer Reflective Film 20 and Multilayer Reflective Film 21>

Next, the substrate with a multilayer reflective film 20 and the multilayer reflective film 21 according to the present embodiment will be described below.

As illustrated in FIG. 2, in the substrate with a multilayer reflective film 20 according to the present embodiment, the multilayer reflective film 21 in which a high refractive index layer and a low refractive index layer are alternately layered is formed on a main surface (front main surface) opposite to a main surface (back main surface) on which the above-described conductive film 23 is formed. The substrate with a multilayer reflective film 20 according to the present embodiment includes the predetermined conductive film 23 on the back main surface. Therefore, the substrate with a multilayer reflective film 20 according to the present embodiment is a type of the substrate with a conductive film 50. The substrate with a multilayer reflective film 20 according to the present embodiment can reflect EUV light having a predetermined wavelength by including the predetermined multilayer reflective film 21.

Note that in the present embodiment, the multilayer reflective film 21 can be formed before the conductive film 23 is formed. Alternatively, the conductive film 23 may be formed as illustrated in FIG. 1, and then the multilayer reflective film 21 may be formed as illustrated in FIG. 2.

The multilayer reflective film 21 provides a function of reflecting EUV light in the reflective mask 40. The multilayer reflective film 21 has a structure of a multilayer film in which layers mainly containing elements having different refractive indexes are periodically layered.

In general, as the multilayer reflective film 21, a multilayer film in which a thin film (high refractive index layer) of a light element that is a high refractive index material or a compound of the light element and a thin film (low refractive index layer) of a heavy element that is a low refractive index material or a compound of the heavy element are alternately layered for about 40 to 60 periods. The multilayer film may be formed by counting, as one period, a stack of a high refractive index layer and a low refractive index layer in which the high refractive index layer and the low refractive index layer are layered in this order from the substrate 10 and building up a plurality of periods of the stack. Alternatively, the multilayer film may be formed by counting, as one period, a stack of a low refractive index layer and high refractive index layer in which the low refractive index layer and the high refractive index layer are layered in this order from the substrate 10 and building up the stack for a plurality of periods. Note that a layer on the outermost surface of the multilayer reflective film 21 (that is, a surface layer of the multilayer reflective film 21 on a side opposite to the substrate 10) is preferably a high refractive index layer. In the multilayer film described above, when a stack (high refractive index layer and low refractive index layer) in which a high refractive index layer and a low refractive index layer are layered in this order on the substrate 10 is counted as one period and the stack is built up for a plurality of periods, the uppermost layer is a low refractive index layer. Since the low refractive index layer on the outermost surface of the multilayer reflective film 21 is easily oxidized, a reflectance of the multilayer reflective film 21 decreases. In order to avoid a decrease in the reflectance, it is preferable to further form a high refractive index layer on the low refractive index layer that is the uppermost layer to form the multilayer reflective film 21. Meanwhile, in the multilayer film described above, when a stack (low refractive index layer and high refractive index layer) in which a low refractive index layer and a high refractive index layer are layered in this order on the substrate 10 is counted as one period and the stack is built up for a plurality of periods, the uppermost layer is a high refractive index layer. In this case, there is no need to further form a high refractive index layer.

In the present embodiment, a layer containing silicon (Si) is adopted as the high refractive index layer. As a material containing Si, in addition to a Si simple substance, a Si compound containing Si and boron (B), carbon (C), nitrogen (N), and/or oxygen (O) can be used. By using a layer containing Si as the high refractive index layer, the reflective mask 40 for EUV lithography having an excellent reflectance for EUV light can be obtained. In addition, in the present embodiment, a glass substrate is preferably used as the substrate 10. Si also has excellent adhesion to the glass substrate. In addition, as the low refractive index layer, a metal simple substance selected from molybdenum (Mo), ruthenium (Ru), rhodium (Rh), and platinum (Pt), or an alloy thereof is used. For example, as the multilayer reflective film 21 for EUV light having a wavelength of 13 nm to 14 nm, a Mo/Si periodic layered film in which a Mo film and a Si film are alternately layered for about 40 to 60 periods is preferably used. Note that the high refractive index layer that is the uppermost layer of the multilayer reflective film 21 can be formed using silicon (Si), and a silicon oxide layer containing silicon and oxygen can be formed between the uppermost layer (Si) and the Ru-based protective film 22. By forming the silicon oxide layer, cleaning resistance of the reflective mask 40 can be improved.

The above-described multilayer reflective film 21 alone usually has a reflectance of 65% or more, and an upper limit of the reflectance is usually 73%. Note that the thickness and period of each constituent layer of the multilayer reflective film 21 can be appropriately selected depending on an exposure wavelength, and can be selected so as to satisfy, for example, the Bragg's reflection law. In the multilayer reflective film 21, there are a plurality of high refractive index layers and a plurality of low refractive index layers. The plurality of high refractive index layers does not need to have the same thickness, and the plurality of low refractive index layers does not need to have the same thickness. In addition, the film thickness of the Si layer that is the outermost surface of the multilayer reflective film 21 can be adjusted in a range that does not lower the reflectance. The film thickness of the Si (high refractive index layer) of the outermost surface can be 3 nm to 10 nm.

A method for forming the multilayer reflective film 21 is known. For example, the multilayer reflective film 21 can be formed by forming each layer of the multilayer reflective film 21 by an ion beam sputtering method. In the case of the above-described Mo/Si periodic multilayer film, for example, by an ion beam sputtering method, first, a Si film having a thickness of about 4 nm is formed on the substrate 10 using an Si target, and then a Mo film having a thickness of about 3 nm is formed using a Mo target. This stack of a Si film and a Mo film is counted as one period, and the stack is built up for 40 to 60 periods to form the multilayer reflective film 21 (the layer on the outermost surface is a Si layer). In addition, when the multilayer reflective film 21 is formed, the multilayer reflective film 21 is preferably formed by supplying krypton (Kr) ion particles from an ion source and performing ion beam sputtering.

<Protective Film 22>

The substrate with a multilayer reflective film 20 (sub-strate with a conductive film 50) according to the present embodiment preferably further includes the protective film 22 disposed in contact with a surface of the multilayer reflective film 21 on a side opposite to the mask blank substrate 10.

The protective film 22 is formed on the multilayer reflec-tive film 21 in order to protect the multilayer reflective film 21 from dry etching and cleaning in a process of manufac-turing the reflective mask 40 described later. In addition, when a black defect of a transfer pattern (the thin film pattern 24a described later) using an electron beam (EB) is corrected, the multilayer reflective film 21 can be protected by the protective film 22. The protective film 22 can have a stack of three or more layers. For example, the protective film 22 can have a structure in which the lowermost layer and the uppermost layer of the protective film 22 are layers containing a substance containing Ru, and a metal other than Ru or an alloy of a metal other than Ru is interposed between the lowermost layer and the uppermost layer. A material of the protective film 22 includes, for example, a material containing ruthenium as a main component. As the material containing ruthenium as a main component, a Ru metal simple substance and a Ru alloy containing Ru and a metal such as titanium (Ti), niobium (Nb), molybdenum (Mo), zirconium (Zr), yttrium (Y), boron (B), lanthanum (La), cobalt (Co), and/or rhenium (Re) can be used. In addition, these materials of the protective film 22 can further contain nitrogen. The protective film 22 is effective for patterning the pattern forming thin film 24 by dry etching with a Cl-based gas.

When a Ru alloy is used as the material of the protective film 22, a Ru content ratio of the Ru alloy is 50 atomic % or more and less than 100 atomic %, preferably 80 atomic % or more and less than 100 atomic %, and more preferably 95 atomic % or more and less than 100 atomic %. In particular, when the Ru content ratio of the Ru alloy is 95 atomic % or more and less than 100 atomic %, the reflec-tance for EUV light can be secured sufficiently while dif-fusion of an element (silicon) constituting the multilayer reflective film 21 to the protective film 22 is suppressed. Furthermore, this protective film 22 can have mask cleaning resistance, an etching stopper function when the pattern forming thin film 24 is etched, and a protective function for preventing a temporal change of the multilayer reflective film 21.

In a case of EUV lithography, since there are few sub-stances that are transparent to exposure light, it is not technically easy to apply an EUV pellicle that prevents a foreign matter from adhering to a mask pattern surface. For this reason, pellicle-less operation without using a pellicle has been the mainstream. In addition, in the case of EUV lithography, exposure contamination such as carbon film deposition on a mask or an oxide film growth due to EUV exposure occurs. Therefore, it is necessary to frequently clean and remove foreign matters and contamination on a mask at a stage where the EUV reflective mask 40 is used for manufacturing a semiconductor device. Therefore, the EUV reflective mask 40 is required to have extraordinary mask cleaning resistance as compared with a transmissive mask for optical lithography. With the use of the Ru-based protective film 22 containing Ti, cleaning resistance to cleaning liquids such as sulfuric acid, a sulfuric acid and hydrogen peroxide mixture (SPM), ammonia, ammonia per-oxide (APM), hydroxyl (OH) radical cleaning water, and ozone water having a concentration of 10 ppm or less can be particularly high. Therefore, it is possible to satisfy the requirement of the mask cleaning resistance for the EUV reflective mask 40.

The thickness of the protective film 22 is not particularly limited as long as the function of the protective film 22 can be achieved. The thickness of the protective film 22 is preferably 1.0 nm to 8.0 nm, and more preferably 1.5 nm to 6.0 nm from a viewpoint of the reflectance for EUV light.

As a method for forming the protective film 22, it is possible to adopt a method similar to a known film forming method without any particular limitation. Specific examples of the method for forming the protective film 22 include a sputtering method and an ion beam sputtering method.

The substrate with a multilayer reflective film 20 accord-ing to the present embodiment can have a base film in contact with a main surface of the substrate 10. The base film is a thin film formed between the substrate 10 and the multilayer reflective film 21. By having the base film, it is possible to prevent charge-up at the time of mask pattern defect inspection using an electron beam, to reduce phase defects of the multilayer reflective film 21, and to obtain high surface smoothness.

As a material of the base film, a material containing ruthenium or tantalum as a main component is preferably used. Specifically, as the material of the base film, for example, a Ru metal simple substance, a Ta metal simple substance, a Ru alloy, or a Ta alloy can be used. As the Ru alloy and the Ta alloy, an alloy containing Ru and/or Ta and a metal such as titanium (Ti), niobium (Nb), molybdenum (Mo), zirconium (Zr), yttrium (Y), boron (B), lanthanum (La), cobalt (Co), and/or rhenium (Re) can be used. The film thickness of the base film can be, for example, in a range of 1 nm to 10 nm.

[Reflective Mask Blank 30]

Next, the reflective mask blank 30 according to the present embodiment will be described. FIG. 3 is a schematic diagram illustrating an example of the reflective mask blank 30 according to the present embodiment. The reflective mask blank 30 according to the present embodiment includes the pattern forming thin film 24 on the multilayer reflective film 21 of the above-described substrate with a multilayer reflective film 20 (substrate with a conductive film 50) or on the protective film 22. That is, the reflective mask blank 30 according to the present embodiment has a structure in which the multilayer reflective film 21 and the pattern forming thin film 24 are layered in this order on one main surface (front main surface) of the substrate 10, and includes the above-described predetermined conductive film 23 on the other main surface (back main surface) of the substrate 10. The reflective mask blank 30 can further have the etching mask film 25 and/or a resist film 32 on the pattern forming thin film 24 (see FIGS. 5 and 6A).

<Pattern Forming Thin Film 24>

The reflective mask blank 30 includes the pattern forming thin film 24 on the above-described substrate with a multilayer reflective film 20. That is, the pattern forming thin film 24 is formed on the multilayer reflective film 21 (on the protective film 22 when protective film 22 is formed). A basic function of the pattern forming thin film 24 is to absorb EUV light. The pattern forming thin film 24 may be the pattern forming thin film 24 for the purpose of absorbing EUV light, or may be the pattern forming thin film 24 having a phase shift function in consideration of a phase difference of EUV light. The pattern forming thin film 24 having a phase shift function absorbs EUV light and partially reflects the EUV light to shift a phase. That is, in the reflective mask 40 in which the pattern forming thin film 24 having a phase shift function is patterned, a portion where the pattern forming thin film 24 is formed reflects a part of light at a level that does not adversely affect pattern transfer while absorbing and attenuating EUV light. In addition, in a region (field portion) where the pattern forming thin film 24 is not formed, EUV light is reflected from the multilayer reflective film 21 via the protective film 22. Therefore, there is a desired phase difference between the reflected light from the pattern forming thin film 24 having a phase shift function and the reflected light from the field portion. The pattern forming thin film 24 having a phase shift function is formed such that a phase difference between the reflected light from the pattern forming thin film 24 and the reflected light from the multilayer reflective film 21 is 170 degrees to 190 degrees. Beams of the light having a reversed phase difference around 180 degrees interfere with each other at a pattern edge portion, and an image contrast of a projected optical image is thereby improved. As the image contrast is improved, resolution is increased, and various exposure-related margins such as an exposure margin and a focus margin can be increased.

The pattern forming thin film 24 may be a single-layer film or a multilayer film formed of a plurality of films (for example, a lower layer pattern forming thin film and an upper layer pattern forming thin film). In the case of a single layer film, the number of steps at the time of manufacturing the reflective mask blank 30 can be reduced and production efficiency is increased. In a case of the multilayer film, an optical constant and film thickness of an upper layer pattern forming thin film can be appropriately set such that the upper layer pattern forming thin film serves as an antireflection film at the time of mask pattern defect inspection using light. This improves inspection sensitivity at the time of mask pattern defect inspection using light. In addition, when a film to which oxygen (O), nitrogen (N), and the like that improve oxidation resistance are added is used as the upper layer pattern forming thin film, temporal stability is improved. As described above, when the pattern forming thin film 24 is a multilayer film, various functions can be added thereto. In a case where the pattern forming thin film 24 is the pattern forming thin film 24 having a phase shift function, when the pattern forming thin film 24 is a multilayer film, a range of adjustment on an optical surface can be increased, and therefore a desired reflectance can be easily obtained.

A material of the pattern forming thin film 24 is not particularly limited as long as the material has a function of absorbing EUV light and can be processed by etching or the like (preferably, can be etched by dry etching of a chlorine (Cl) and/or fluorine (F)-based gas). As a material having such a function, a tantalum (Ta) simple substance or a material containing Ta can be preferably used.

Examples of the material containing Ta include a material containing Ta and B, a material containing Ta and N, a material containing Ta, B, and at least one of O and N, a material containing Ta and Si, a material containing Ta, Si, and N, a material containing Ta and Ge, a material containing Ta, Ge, and N, a material containing Ta and Pd, a material containing Ta and Ru, a material containing Ta and Ti, and the like.

The pattern forming thin film 24 can be formed of, for example, a material containing at least one selected from the group consisting of a Ni simple substance, a material containing Ni, a Cr simple substance, a material containing Cr, a Ru simple substance, a material containing Ru, a Pd simple substance, a material containing Pd, a Mo simple substance, and a material containing Mo.

The pattern forming thin film 24 can be a thin film similar to the upper layer 232 of the above-described predetermined conductive film 23. That is, the pattern forming thin film 24 according to the present embodiment can be a thin film (predetermined thin film) containing chromium (Cr) and having a crystallinity. In addition, the predetermined thin film can further contain nitrogen. The predetermined thin film can have a predetermined diffracted X-ray spectrum when a diffracted X-ray intensity with respect to the diffraction angle $2\theta$ is measured by an X-ray diffraction method using a $CuK_\alpha$ ray for the predetermined thin film. By inclusion of chromium (Cr) and nitrogen (N) having a predetermined crystal structure having a predetermined diffracted X-ray spectrum in the pattern forming thin film 24, chemical resistance of the pattern forming thin film 24, particularly resistance to SPM cleaning can be further enhanced.

In order to appropriately absorb EUV light, the pattern forming thin film 24 preferably has a thickness of 30 nm to 100 nm.

The pattern forming thin film 24 can be formed by a known method, for example, a magnetron sputtering method, an ion beam sputtering method, or the like.

<Etching Mask Film 25>

The etching mask film 25 may be formed on the pattern forming thin film 24. As a material of the etching mask film 25, a material having a high etching selective ratio of the pattern forming thin film 24 to the etching mask film 25 is used. Here, the expression of "an etching selective ratio of B to A" means a ratio of an etching rate of B that is a layer desired to be etched to an etching rate of A that is a layer not desired to be etched (layer to serve as a mask). Specifically, "an etching selective ratio of B to A" is specified by a formula of "etching selective ratio of B to A=etching rate of B/etching rate of A". In addition, the expression of "high selective ratio" means that a value of the selective ratio defined above is large as compared with that of an object for comparison. The etching selective ratio of the pattern forming thin film 24 to the etching mask film 25 is preferably 1.5 or more, and more preferably 3 or more.

Examples of the material having a high etching selective ratio of the pattern forming thin film 24 to the etching mask film 25 include a chromium material and a chromium compound material. Therefore, when the pattern forming thin film 24 is etched with a fluorine-based gas, a chromium material and a chromium compound material can be used. Examples of the chromium compound include a material containing Cr and at least one element selected from N, O, C, and H. In addition, when the pattern forming thin film 24 is etched with a chlorine-based gas substantially containing no oxygen, a silicon material or a silicon compound material can be used. Examples of the silicon compound include a material containing Si and at least one element selected from N, O, C and H and a material such as metallic silicon containing a metal in silicon or a silicon compound (metal silicide) or a metal silicon compound (metal silicide compound). Examples of the metal silicon compound include a material containing a metal, Si, and at least one element selected from N, O, C, and H.

The film thickness of the etching mask film 25 is desirably 3 nm or more from a viewpoint of obtaining a function as an etching mask for accurately forming a transfer pattern on the pattern forming thin film 24. In addition, the film thickness of the etching mask film 25 is desirably 15 nm or less from a viewpoint of reducing the film thickness of the resist film 32.

The etching mask film 25 can be a thin film similar to the upper layer 232 of the above-described predetermined conductive film 23. That is, the etching mask film 25 according to the present embodiment can be a thin film (predetermined thin film) containing chromium (Cr) and having a crystallinity. In addition, the predetermined thin film can further contain nitrogen. The predetermined thin film can have a predetermined diffracted X-ray spectrum when a diffracted X-ray intensity with respect to the diffraction angle 2θ is measured by an X-ray diffraction method using a CuK$_\alpha$ ray for the predetermined thin film. By inclusion of chromium (Cr) and nitrogen (N) having a predetermined crystal structure having a predetermined diffracted X-ray spectrum in the etching mask film 25, chemical resistance of the etching mask film 25, particularly resistance to SPM cleaning can be further enhanced.

[Reflective Mask 40]

Next, the reflective mask 40 according to the present embodiment will be described below. FIG. 4 is a schematic diagram illustrating the reflective mask 40 according to the present embodiment. In the reflective mask 40 according to the present embodiment, a transfer pattern is formed on the pattern forming thin film 24 of the reflective mask blank 30.

The reflective mask 40 according to the present embodiment has a structure in which the pattern forming thin film 24 in the above reflective mask blank 30 is patterned to form the thin film pattern 24a of the pattern forming thin film 24 on the multilayer reflective film 21 or the protective film 22. When the reflective mask 40 according to the present embodiment is exposed with exposure light such as EUV light, the exposure light is absorbed in a portion where the pattern forming thin film 24 is present on a surface of the reflective mask 40, and the exposure light is reflected by the exposed protective film 22 and multilayer reflective film 21 in the other portions where the pattern forming thin film 24 has been removed. As a result, the reflective mask 40 can be used as the reflective mask 40 for EUV lithography.

By inclusion of the thin film pattern 24a on the multilayer reflective film 21 (or on the protective film 22) in the reflective mask 40 according to the present embodiment, a predetermined pattern can be transferred onto a transferred object using EUV light.

The reflective mask 40 according to the present embodiment includes the conductive film 23 having excellent chemical resistance. Therefore, even if the reflective mask 40 according to the present embodiment is repeatedly cleaned using a chemical such as a chemical solution, deterioration of the reflective mask 40 can be suppressed. Therefore, it can be said that the reflective mask 40 of the present disclosure can have a highly accurate transfer pattern.

[Method for Manufacturing Semiconductor Device]

A method for manufacturing a semiconductor device according to the present embodiment includes a step of exposing and transferring a transfer pattern onto a resist film on a semiconductor substrate using the reflective mask 40 according to the present embodiment. That is, by transferring a transfer pattern such as a circuit pattern based on the thin film pattern 24a of the reflective mask 40 onto a resist film formed on a transfer object such as a semiconductor substrate by a lithography process using the reflective mask 40 described above and an exposure device, and performing various other processes thereon, it is possible to manufacture a semiconductor device in which various transfer patterns and the like are formed on the transfer object such as a semiconductor substrate.

According to the method for manufacturing a semiconductor device according to the present embodiment, the reflective mask 40 having the conductive film 23 and/or the thin film pattern 24a having excellent chemical resistance can be used for manufacturing a semiconductor device. Even if the reflective mask 40 is repeatedly cleaned using a chemical such as a chemical solution (for example, a sulfuric acid and hydrogen peroxide mixture in a case of SPM cleaning), deterioration of the conductive film 23 and/or the thin film pattern 24a of the reflective mask 40 can be suppressed. Therefore, even when the reflective mask 40 is repeatedly used, a semiconductor device having a fine and highly accurate transfer pattern can be manufactured.

EXAMPLES

Hereinafter, Examples will be described with reference to the drawings. However, the present disclosure is not limited to these Examples.

Example 1

First, a substrate with a conductive film 50 of Example 1 will be described.

A substrate 10 for manufacturing the substrate with a conductive film 50 of Example 1 was prepared as follows. That is, an SiO$_2$—TiO$_2$-based glass substrate that is a low thermal expansion glass substrate having a 6025 size (approximately 152 mm×152 mm×6.35 mm) in which both main surfaces that are a front main surface and a back main surface were polished was prepared as the substrate 10. The main surfaces were subjected to polishing including a rough polishing step, a precision polishing step, a local processing step, and a touch polishing step such that the main surfaces were flat and smooth.

A lower layer 231 formed of a CrON film was formed on the back main surface of the SiO$_2$—TiO$_2$-based glass substrate (mask blank substrate 10) of Example 1, and an upper layer 232 formed of a CrN film was formed on the lower layer 231 to form the conductive film 23.

The CrON film (lower layer 231) was formed so as to have a film thickness of 15 nm in a mixed gas atmosphere of an Ar gas, a N$_2$ gas, and an O$_2$ gas using a Cr target by a reactive sputtering method (DC magnetron sputtering method). When the composition (atomic %) of the CrON film was measured by X-ray photoelectron spectroscopy (XPS method), the atomic ratio of chromium (Cr) was 88 atomic %, the atomic ratio of oxygen (O) was 6 atomic %, and the atomic ratio of nitrogen (N) was 6 atomic %.

Subsequently, the upper layer 232 formed of a CrN film was formed on the lower layer 231. The CrN film (upper layer 232) was formed so as to have a film thickness of 180 nm in a mixed gas atmosphere of an Ar gas and a $N_2$ gas using a Cr target by a reactive sputtering method (DC magnetron sputtering method). When the composition (atomic %) of the CrN film was measured by X-ray photo-electron spectroscopy (XPS method), the atomic ratio of chromium (Cr) was 91 atomic %, and the atomic ratio of nitrogen (N) was 9 atomic %.

For the conductive film 23 of Example 1, a diffracted X-ray intensity with respect to the diffraction angle 2θ was measured by an X-ray diffraction method using a $CuK_\alpha$ ray. As an X-ray diffractometer, a SmartLab manufactured by Rigaku Corporation was used. The diffracted X-ray spectrum was measured using a Cu—$K_\alpha$ ray source in a range where the diffraction angle 2θ was 30 degrees to 70 degrees under conditions of a sampling width of 0.01 degrees and a scan speed of 2 degrees/minute. The conductive film 23 was irradiated with an X-ray generated using the Cu—$K_\alpha$ ray source, and a diffracted X-ray intensity at the diffraction angle 2θ was measured to obtain a diffracted X-ray spectrum. From the obtained diffracted X-ray spectrum, presence or absence of a peak was determined in a range where the diffraction angle 2θ is 56 degrees or more and 60 degrees or less, in a range where the diffraction angle 2θ is 41 degrees or more and 47 degrees or less, and in a range where the diffraction angle 2θ is 35 degrees or more and 38 degrees or less. Note that as for the determination of presence or absence of a peak, when the height of a peak obtained by subtracting a background from a measured diffracted X-ray spectrum was twice or more the magnitude of a background noise (noise width) around the peak, it was determined that there was a peak. Note that no peak of the CrON film (lower layer 231) was observed in the obtained diffracted X-ray spectrum. Therefore, it can be said that the diffracted X-ray spectrum obtained by the measurement is the diffracted X-ray spectrum of the CrN film (upper layer 232). The same applies to diffracted X-ray spectra of Comparative Examples 1 and 2.

FIG. 7 illustrates the diffracted X-ray spectrum of Example 1. As is clear from FIG. 7, in the conductive film 23 (upper layer 232) of Example 1, there was a peak in a range where the diffraction angle 2θ is 56 degrees or more and 60 degrees or less and in a range where the diffraction angle 2θ is 41 degrees or more and 47 degrees or less, but there was no peak in a range where the diffraction angle 2θ is 35 degrees or more and 38 degrees or less. Table 1 illustrates presence or absence of a peak in each range of the diffraction angle 2θ in Example 1.

The substrate with a conductive film 50 of Example 1 was manufactured as described above.

Here, an evaluation thin film of Example 1 was prepared in which a conductive film was formed on the substrate 10 under the same film forming conditions as described above. The surface roughness (Rms), the sheet resistance (Ω/□), and the film reduction amount (nm) by SPM cleaning of the obtained evaluation thin film of Example 1 were measured. Table 1 illustrates measurement results.

The film reduction amount (nm) of the substrate with a conductive film 50 of Example 1 by SPM cleaning was calculated by measuring the film thickness before and after SPM cleaning was performed once under the following cleaning conditions.

| | |
|---|---|
| Cleaning liquid | $H_2SO_4$:$H_2O_2$ = 2:1 (weight ratio) |
| Cleaning temperature | 120° C. |
| Cleaning time | 10 minutes |

As described above, the substrate with a conductive film 50 of Example 1 was manufactured and evaluated.

Comparative Example 1

A substrate with a conductive film 50 of Comparative Example 1 includes a conductive film 23 including a lower layer 231 formed of a CrON film and an upper layer 232 formed of a CrN film as in Example 1. However, the film forming conditions (flow rate of a $N_2$ gas) and the atomic ratio of the CrN film (upper layer 232) of the conductive film 23 of Comparative Example 1 are different from those of Example 1. The substrate with a conductive film 50 of Comparative Example 1 was manufactured in a similar manner to Example 1 except for these. The CrN film (upper layer 232) of Comparative Example 1 was formed so as to have a film thickness of 180 nm. When the composition (atomic %) of the CrN film (upper layer 232) was measured by X-ray photoelectron spectroscopy (XPS method), the atomic ratio of chromium (Cr) was 84 atomic %, and the atomic ratio of nitrogen (N) was 16 atomic %.

Figure 8:
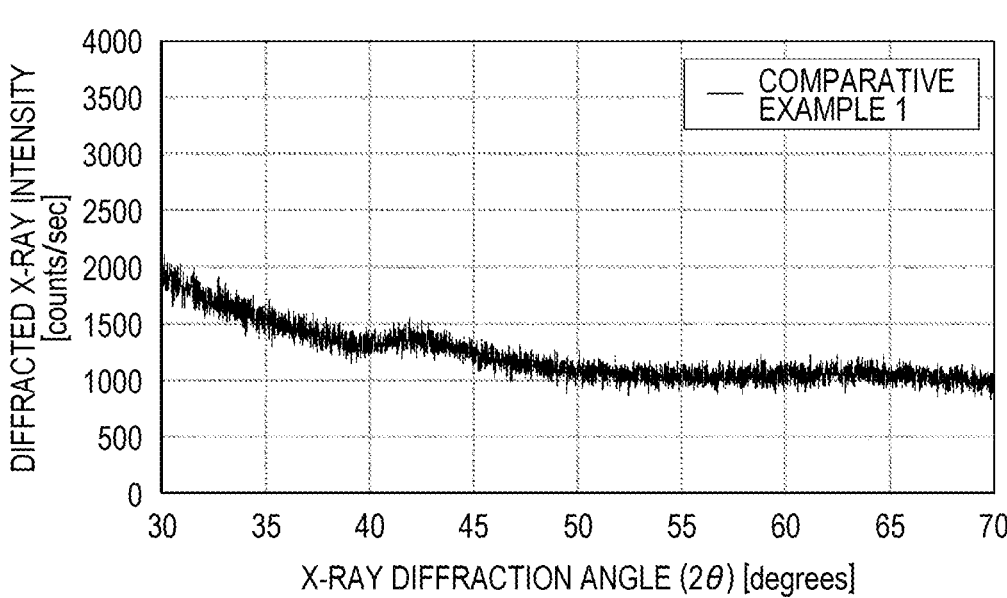
FIG. 8 is a diagram (diffracted X-ray spectrum) illustrating a diffracted X-ray intensity (counts/second) with respect to an X-ray diffraction angle (2θ) for Comparative Example 1.

For the conductive film 23 (upper layer 232) of Comparative Example 1, a diffracted X-ray intensity with respect to the diffraction angle 2θ was measured by an X-ray diffraction method using a $CuK_\alpha$ ray in a similar manner to Example 1. FIG. 8 illustrates a diffracted X-ray spectrum of Comparative Example 1. As is clear from FIG. 8, in the upper layer 232 of the conductive film 23 of Comparative Example 1, there was no peak in any of a range where the diffraction angle 2θ is 56 degrees or more and 60 degrees or less, a range where the diffraction angle 2θ is 41 degrees or more and 47 degrees or less, and a range where the diffraction angle 2θ is 35 degrees or more and 38 degrees or less. This indicates that the conductive film 23 of Comparative Example 1 is a thin film having an amorphous structure. Table 1 illustrates presence or absence of a peak in each range of the diffraction angle 2θ in Comparative Example 1.

Here, an evaluation thin film of Comparative Example 1 was prepared in which a conductive film was formed on the substrate 10 under the same film forming conditions as Comparative Example 1 described above. The surface roughness (Rms), the sheet resistance (Ω/□), and the film reduction amount (nm) by SPM cleaning of the evaluation thin film of Comparative Example 1 were measured in a similar manner to Example 1. Table 1 illustrates measurement results.

As described above, the substrate with a conductive film 50 of Comparative Example 1 was manufactured and evaluated.

Comparative Example 2

A substrate with a conductive film 50 of Comparative Example 2 is different from the substrate with a conductive film 50 of Example 1 in that a conductive film 23 is formed only of the upper layer 232 of Example 1. The substrate with a conductive film 50 of Comparative Example 2 was manufactured in a similar manner to Example 1 except for these. That is, the conductive film 23 of Comparative Example 2 is obtained by forming a CrN film so as to have a film thickness of 180 nm under the same film forming conditions as those of the upper layer 232 of Example 1. When the composition (atomic %) of the conductive film (CrN film) 23 was measured by X-ray photoelectron spectroscopy (XPS method), the atomic ratio of chromium (Cr) was 91 atomic %, and the atomic ratio of nitrogen (N) was 9 atomic %.

For the conductive film 23 of Comparative Example 2, a diffracted X-ray intensity with respect to the diffraction angle $2\theta$ was measured by an X-ray diffraction method using a $CuK_\alpha$ ray in a similar manner to Example 1. As a result, there was a tendency similar to that of the upper layer 232 of Example 1.

Here, an evaluation thin film of Comparative Example 2 was prepared in which a conductive film was formed on the substrate 10 under the same film forming conditions as Comparative Example 2 described above. The surface roughness (Rms), the sheet resistance ($\Omega/\square$), and the film reduction amount (nm) by SPM cleaning of the evaluation thin film of Comparative Example 2 were measured in a similar manner to Example 1. Table 1 illustrates measurement results.

As described above, the substrate with a conductive film 50 of Comparative Example 2 was manufactured and evaluated.

Comparison of Example 1, Comparative Example 1, and Comparative Example 2

As illustrated in Table 1, the sheet resistance of the conductive film 23 of the substrate with a conductive film 50 of Example 1 was 150 $\Omega/\square$ or less, which was a value satisfactory as the conductive film 23 of the reflective mask 40. In addition, the film reduction amount of the conductive film 23 of Example 1 by SPM cleaning was 0.1 nm, which was a value satisfactory as the conductive film 23 of the reflective mask 40. In addition, since the surface roughness (Rms) of the conductive film 23 of Example 1 was 0.31 nm, it can be said that it is possible to prevent generation of particles due to rubbing between the conductive film 23 and an electrostatic chuck.

As illustrated in Table 1, the sheet resistance of the conductive film 23 of the substrate with a conductive film 50 of Comparative Example 1 was 150 $\Omega/\square$ or less, which was a value satisfactory as the conductive film 23 of the reflective mask 40. In addition, since the surface roughness (Rms) of the conductive film 23 of Comparative Example 1 was 0.28 nm, it can be said that it is possible to prevent generation of particles due to rubbing between the conductive film 23 and an electrostatic chuck. However, the film reduction amount of the conductive film 23 of Comparative Example 1 by SPM cleaning was 1.4 nm, which was not a value satisfactory as the conductive film 23 of the reflective mask 40.

As illustrated in Table 1, the sheet resistance of the conductive film 23 of the substrate with a conductive film 50 of Comparative Example 2 was 150 $\Omega/\square$ or less, which was a value satisfactory as the conductive film 23 of the reflective mask 40. In addition, the film reduction amount of the conductive film 23 of Comparative Example 2 by SPM cleaning was 0.1 nm, which was a value satisfactory as the conductive film 23 of the reflective mask 40. However, since the surface roughness (Rms) of the conductive film 23 of Comparative Example 2 was 0.71 nm, it can be said that it is difficult to prevent generation of particles due to rubbing between the conductive film 23 and an electrostatic chuck.

From the above, it has become clear that the conductive film 23 of the reflective mask 40 of Example 1 is the conductive film 23 having excellent chemical resistance and a small surface roughness (Rms).

[Substrate with a Multilayer Reflective Film 20]

Next, a substrate with a multilayer reflective film 20 of Example 1 will be described. By forming the multilayer reflective film 21 and the protective film 22 on a front main surface of the substrate 10 opposite to a side on which the conductive film 23 of the substrate with a conductive film 50 manufactured as described above was formed, the substrate with a multilayer reflective film 20 was manufactured. Specifically, the substrate with a multilayer reflective film 20 was manufactured as follows.

The multilayer reflective film 21 was formed on the front main surface of the substrate 10 opposite to the side where the conductive film 23 was formed. The multilayer reflective film 21 formed on the substrate 10 was the periodic multilayer reflective film 21 containing Mo and Si in order to make the multilayer reflective film 21 suitable for EUV light having a wavelength of 13.5 nm. Using a Mo target and a Si target, the multilayer reflective film 21 was formed by alternately building up a Mo layer and a Si layer on the substrate 10 in an Ar gas atmosphere by an ion beam sputtering method. First, a Si film was formed so as to have a thickness of 4.2 nm, and subsequently a Mo film was formed so as to have a thickness of 2.8 nm. This stack of a Si film and a Mo film was counted as one period, and a Si film and a Mo film were built up for 40 periods in a similar manner. Finally, a Si film was formed so as to have a thickness of 4.0 nm to form the multilayer reflective film 21. The number of periods was 40 periods here, but the number of periods is not limited to this number, but may be, for example, 60 periods. In the case of 60 periods, the number of steps is larger than the number of steps in the case of 40 periods, but reflectance for EUV light can be increased.

Subsequently, the protective film 22 formed of a Ru film was formed so as to have a thickness of 2.5 nm in an Ar gas atmosphere by an ion beam sputtering method using a Ru target.

The substrate with a multilayer reflective film 20 of Example 1 was manufactured as described above.

[Reflective Mask Blank 30]

Next, a reflective mask blank 30 of Example 1 will be described. By forming a pattern forming thin film 24 on the protective film 22 of the substrate with a multilayer reflective film 20 manufactured as described above, the reflective mask blank 30 was manufactured.

The pattern forming thin film 24 was formed on the protective film 22 of the substrate with a multilayer reflective film 20 by a DC magnetron sputtering method. The pattern forming thin film 24 was the pattern forming thin film 24 of a layered film including two layers of a TaN film as an absorption layer and a TaO film as a low reflection layer. The TaN film was formed as an absorption layer on a surface of the protective film 22 of the substrate with a multilayer reflective film 20 described above by a DC magnetron sputtering method. The TaN film was formed in a mixed gas atmosphere of an Ar gas and a $N_2$ gas with the substrate with a multilayer reflective film 20 facing a Ta target by a reactive sputtering method. Next, the TaO film (low reflection layer) was further formed on the TaN film by a DC magnetron sputtering method. Similarly to the TaN film, this TaO film was formed in a mixed gas atmosphere of Ar and $O_2$ with the substrate with a multilayer reflective film 20 facing a Ta target by a reactive sputtering method.

The composition (atomic ratio) of the TaN film was Ta:N=70:30, and the TaN film had a film thickness of 48 nm. The composition (atomic ratio) of the TaO film was Ta:O=35:65, and the TaO film had a film thickness of 11 nm.

As described above, the reflective mask blank 30 of Example 1 was manufactured.

[Reflective Mask 40]

Next, a reflective mask 40 of Example 1 will be described. The reflective mask 40 was manufactured using the reflective mask blank 30 described above. FIGS. 6A to 6D are schematic cross-sectional diagrams of a main part illustrating a process for manufacturing the reflective mask 40 from the reflective mask blank 30.

Figure 6A:
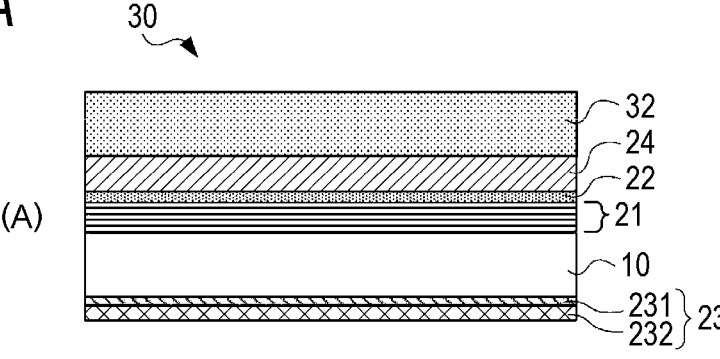
FIGS. 6A to 6D are process diagrams illustrating a process of preparing a reflective mask from a reflective mask blank in a schematic cross-sectional diagram.
Figure 6B:
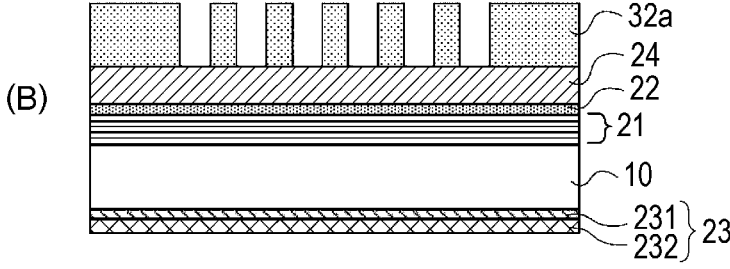

A resist film 32 having a thickness of 150 nm was formed on the pattern forming thin film 24 of the reflective mask blank 30 of Example 1 described above, and the resulting product was used as the reflective mask blank 30 (FIG. 6A). A desired pattern was drawn (exposed) on this resist film 32, and further developed and rinsed to form a predetermined resist pattern 32a (FIG. 6B). Next, the pattern forming thin film 24 was dry-etched using the resist pattern 32a as a mask turing a semiconductor device, it can be said that a semiconductor device having a fine and highly accurate transfer pattern can be manufactured.

The reflective mask 40 prepared in Example 1 was set in an EUV exposure device, and EUV exposure was performed on a wafer on which a film to be processed and a resist film were formed on a semiconductor substrate. Then, this resist film that had been subjected to exposure was developed to form a resist pattern on the semiconductor substrate on which the film to be processed was formed.

This resist pattern was transferred onto a film to be processed by etching, and through various steps such as formation of an insulating film and a conductive film, introduction of a dopant, and annealing, a semiconductor device having desired characteristics could be manufactured.

TABLE 1

Figure 6C:
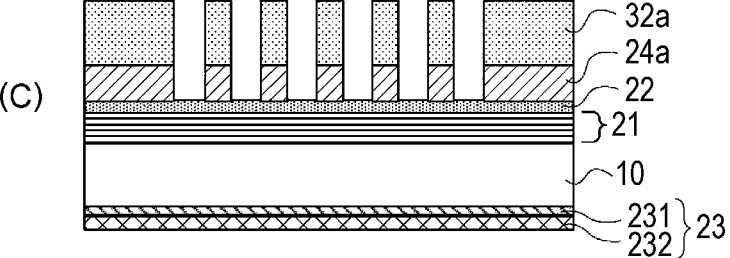
Figure 6D:
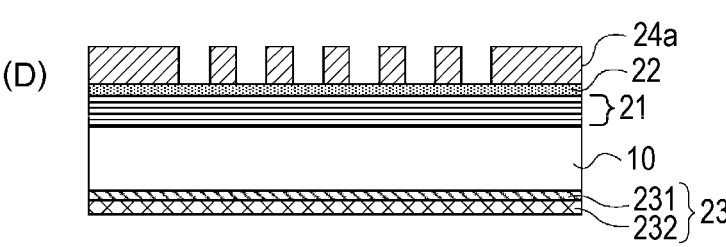

| | Peak in range of 56 degrees ≤ 2θ ≤ 60 degrees | Peak in range of 41 degrees ≤ 2θ ≤ 47 degrees | Peak in range of 35 degrees ≤ 2θ ≤ 38 degrees | surface roughness Rms (nm) | Sheet resistance (Ω/□) | Film reduction amount (nm) by SPM cleaning |
|---|---|---|---|---|---|---|
| Example 1 | Present | Present | Absent | 0.31 | 55 | 0.1 |
| Comparative Example 1 | Absent | Absent | Absent | 0.28 | 138 | 1.4 |
| Comparative Example 2 | Present | Present | Absent | 0.71 | 58 | 0.1 | to form a pattern (thin film pattern 24a) of the pattern forming thin film 24 (FIG. 6C). Note that the TaN film and the TaO film of the pattern forming thin film 24 were both patterned by dry etching using a mixed gas of $CF_4$ and He.

Thereafter, the resist pattern 32a was removed, for example, by ashing or with a resist stripper liquid. Finally, the same SPM cleaning as the above-described cleaning conditions at the time of measuring the film reduction amount by SPM cleaning was performed. The reflective mask 40 was manufactured as described above (FIG. 6D). Note that a mask defect inspection can be performed as necessary after the wet cleaning, and a mask defect can be corrected appropriately.

As described in the evaluation of the substrate with a conductive film 50 of Example 1 described above, the substrate with a conductive film 50 including the conductive film 23 of Example 1 according to the present embodiment has excellent SPM cleaning resistance. Therefore, the reflective mask 40 including the conductive film 23 according to the present embodiment also has excellent SPM cleaning resistance. Therefore, even when SPM cleaning is performed on the reflective mask 40, sheet resistance and mechanical strength required for the conductive film 23 are not impaired. Therefore, even if the reflective mask 40 according to the present embodiment is used for manufacturing a semiconductor device, the reflective mask 40 can be fixed by an electrostatic chuck without any problem. In addition, the surface roughness (Rms) of the substrate with a conductive film 50 including the conductive film 23 of Example 1 according to the present embodiment is small. Therefore, it is possible to prevent generation of particles due to rubbing between the conductive film 23 and an electrostatic chuck. Therefore, when the reflective mask 40 according to the present embodiment is used for manufac-

REFERENCE SIGNS LIST

10 Mask blank substrate
20 Substrate with a multilayer reflective film
21 Multilayer reflective film
22 Protective film
23 Conductive film
24 Pattern forming thin film
24a Thin film pattern
25 Etching mask film
30 Reflective mask blank
32 Resist film
32a Resist pattern
40 Reflective mask
50 Substrate with a conductive film
231 Lower layer
232 Upper layer

The invention claimed is:

1. A substrate with a conductive film comprising a conductive film on one of two main surfaces of the substrate, wherein the conductive film comprises a structure in which a lower layer and an upper layer are layered in this order from the substrate side, the lower layer is amorphous, the upper layer has a crystallinity, when a diffracted X-ray spectrum of a diffracted X-ray intensity with respect to a diffraction angle 2θ is measured by an X-ray diffraction method for the upper layer, the diffracted X-ray spectrum has peaks in a range where the diffraction angle 2θ is 41 degrees or more and 47 degrees or less and in a range where the diffraction angle 2θ is 56 degrees or more and 60 degrees or less, the upper layer comprises chromium and nitrogen, and the nitrogen content of the upper layer is 1 atomic % or more and 15 atomic % or less.

2. The substrate with a conductive film according to claim 1, wherein the lower layer comprises chromium and oxygen.

3. The substrate with a conductive film according to claim 1, wherein a chromium content of the upper layer is larger than a chromium content of the lower layer.

4. The substrate with a conductive film according to claim 1, wherein the upper layer has no peak detected in a range where the diffraction angle 2θ is 35 degrees or more and 38 degrees or less.

5. The substrate with a conductive film according to claim 1, wherein the lower layer comprises chromium and oxygen, and the oxygen content of the lower layer is 1 atomic % or more and 20 atomic % or less.

6. The substrate with a conductive film according to claim 1, wherein the lower layer comprises chromium, oxygen and nitrogen.

7. A substrate with a conductive film, wherein a multilayer reflective film in which a high refractive index layer and a low refractive index layer are alternately layered is formed on the main surface opposite to the main surface on which the conductive film of the substrate with a conductive film according to claim 1 is formed.

8. The substrate with a conductive film according to claim 7, wherein a protective film is formed on the multilayer reflective film.

9. A reflective mask blank comprising a structure in which a multilayer reflective film and a pattern forming thin film are layered in this order on one main surface of a substrate, the reflective mask blank comprising a conductive film on the other main surface of the substrate, wherein the conductive film comprises a structure in which a lower layer and an upper layer are layered in this order from the substrate side, the lower layer is amorphous, the upper layer has a crystallinity, when a diffracted X-ray spectrum of a diffracted X-ray intensity with respect to a diffraction angle 2θ is measured by an X-ray diffraction method for the upper layer, the diffracted X-ray spectrum has peaks in a range where the diffraction angle 2θ is 41 degrees or more and 47 degrees or less and in a range where the diffraction angle 2θ is 56 degrees or more and 60 degrees or less, the upper layer comprises chromium and nitrogen, and the nitrogen content of the upper layer is 1 atomic % or more and 15 atomic % or less.

10. The reflective mask blank according to claim 9, wherein the lower layer comprises chromium and oxygen.

11. The reflective mask blank according to claim 9, wherein a chromium content of the upper layer is larger than a chromium content of the lower layer.

12. The reflective mask blank according to claim 9, wherein the upper layer has no peak detected in a range where the diffraction angle 2θ is 35 degrees or more and 38 degrees or less.

13. The reflective mask blank according to claim 9, wherein a protective film is formed between the multilayer reflective film and the pattern forming thin film.

14. The reflective mask blank according to claim 9, wherein the lower layer comprises chromium and oxygen, and the oxygen content of the lower layer is 1 atomic % or more and 20 atomic % or less.

15. The reflective mask blank according to claim 9, wherein the lower layer comprises chromium, oxygen and nitrogen.

16. A reflective mask comprising a transfer pattern formed on the pattern forming thin film of the reflective mask blank according to claim 10.

17. A method for manufacturing a semiconductor device, the method comprising exposing and transferring a transfer pattern onto a resist film on a semiconductor substrate using the reflective mask according to claim 16.

\* \* \* \* \*